United States Patent [19]

Peng

[11] Patent Number: 4,967,197

[45] Date of Patent: Oct. 30, 1990

[54] ERROR CORRECTION SYSTEM FOR DIGITAL TO ANALOG CONVERTERS

[75] Inventor: Yung-Chow Peng, Hsin-Chu, Taiwan

[73] Assignee: Industrial Technology Research Institute, R.O.C., Hsinchu, Taiwan

[21] Appl. No.: 352,992

[22] Filed: May 17, 1989

[51] Int. Cl.[5] ............................................ H03M 1/06

[52] U.S. Cl. .................................... 341/118; 341/131; 341/144

[58] Field of Search ............... 341/118, 131, 127, 138, 341/145, 154, 144, 153, 154; 330/9; 363/123; 323/269, 271, 272

[56] References Cited

U.S. PATENT DOCUMENTS 4,465,996 8/1984 Boyacigiller et al. .............. 341/118

4,647,907 3/1987 Storey ................................ 341/118

*Primary Examiner*—William M. Shoop, Jr.
*Assistant Examiner*—Brian K. Young
*Attorney, Agent, or Firm*—Hung Chang Lin

[57] ABSTRACT

A high resolution digital to analog conversion system using a medium resolution converter compensated for error correction. The errors of more significant bits are stored in a memory during correction mode and recalled during normal operation. The errors are evaluated by comparing the binary weighted currents of a sub-DAC with corresponding reference currents and stored in the memory. The comparing operation is exercised by sequential approximation method for fast execution and simpler circuitry.

4 Claims, 4 Drawing Sheets

Ic
$I_0$
12 bit binary
$S_{11}$…$S_0$
op1
op2
comp
RAM 34×12
control logic

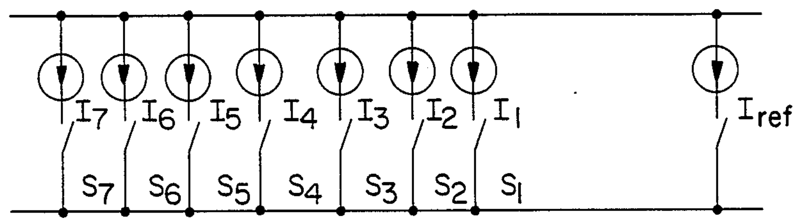
FIG. 1
I7
I6
I5
I4
I3
I2
I1
Iref
S7
S6
S5
S4
S3
S2
S1
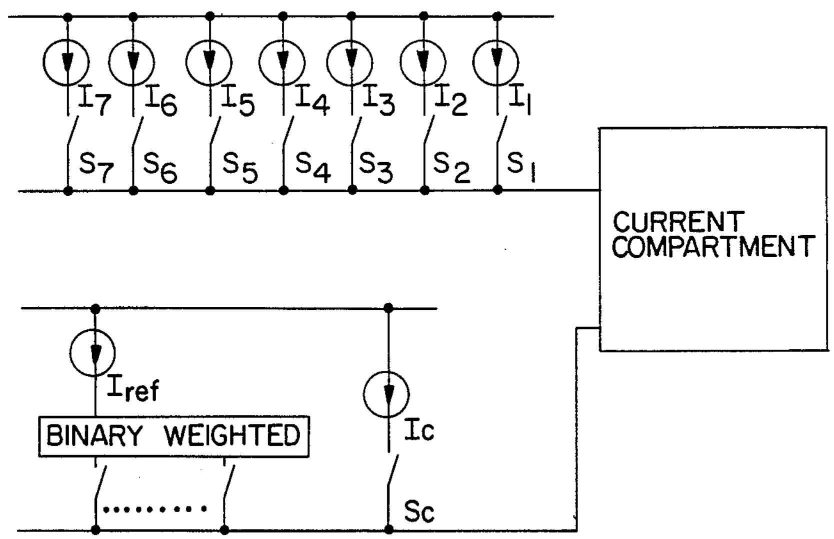
FIG. 2
I7
I6
I5
I4
I3
I2
I1
S7
S6
S5
S4
S3
S2
S1
CURRENT COMPARTMENT
Iref
BINARY WEIGHTED
Ic
Sc
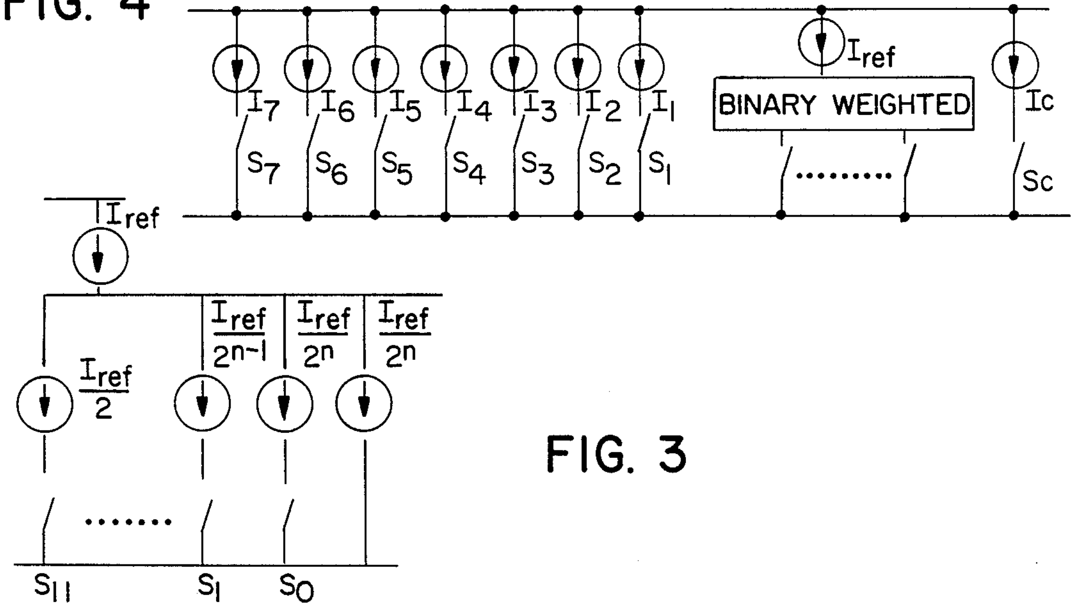
FIG. 4
I7
I6
I5
I4
I3
I2
I1
Iref
BINARY WEIGHTED
Ic
S7
S6
S5
S4
S3
S2
S1
Sc
Iref
Iref/2
Iref/2n-1
Iref/2n
Iref/2n
S11
S1
S0
FIG. 3

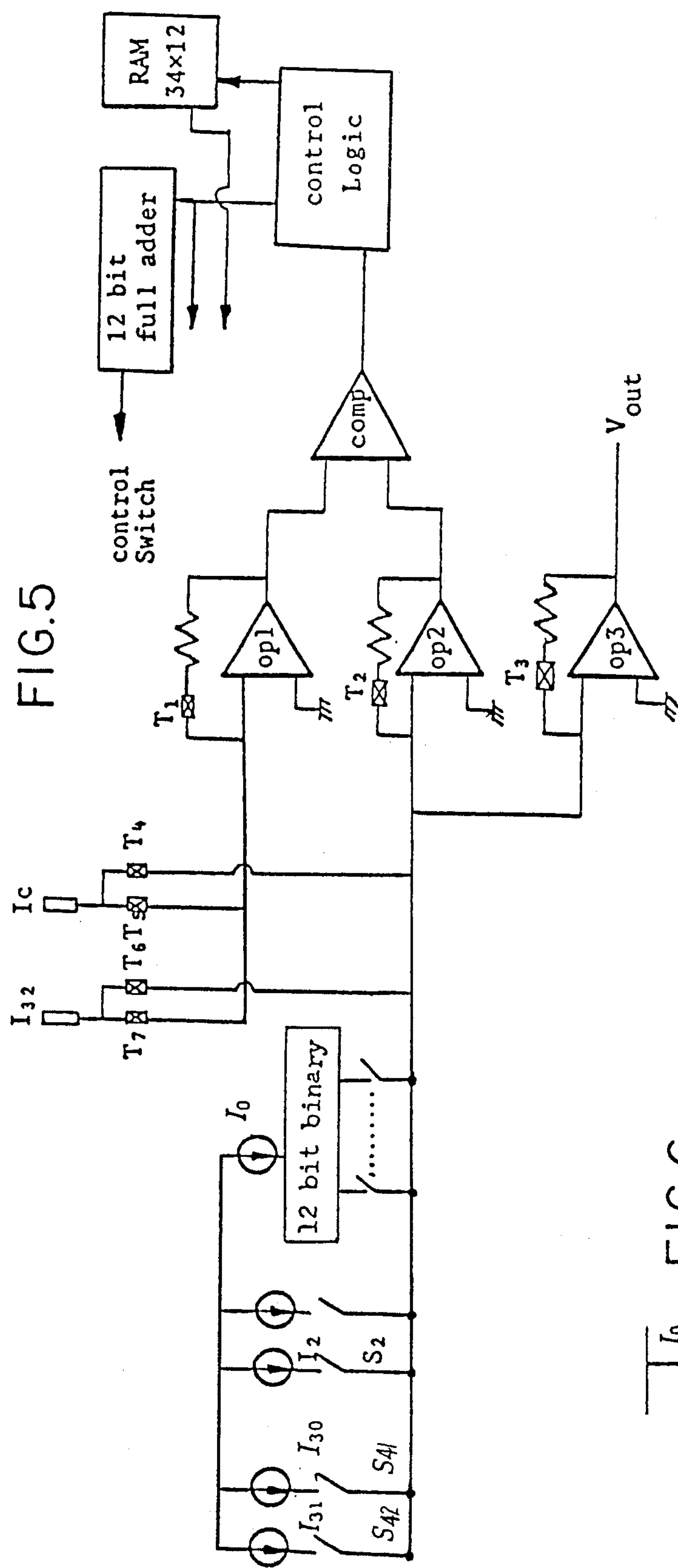
FIG. 5
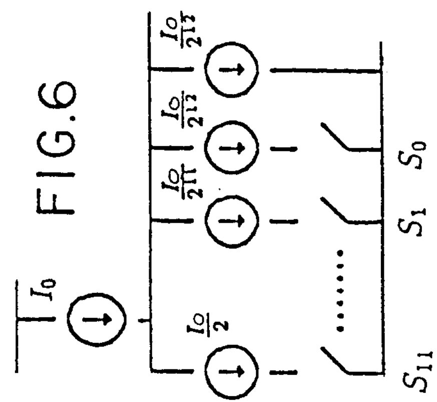
FIG. 6
FIG. 7 control logic
RAM
control switch
op3
$V_{out}$
Ic
$T_4$
12 bit binary
$I_0$
$S_0$
$S_{11}$
$I_1$
$I_2$
$I_{30}$
$I_{31}$
$S_1$
$S_2$
$S_{41}$
$S_{42}$ control logic
comp
op1
op2
Ic
$T_5$
$I_{32}$
$T_7$
12 bit binary
$I_0$
Ii
$S_{11}$
$S_0$

ERROR CORRECTION SYSTEM FOR DIGITAL TO ANALOG CONVERTERS

BACKGROUND OF THE INVENTION

Recent papers and patents on high resolution digital to analog (D/A) conversion technique have proposed trimmed analog device, reference refreshing cyclic method and dynamic element matching method, etc. However, because of the stringent requirement and the lack of satisfactory algorithm, the conversion rate has not achieved high speed.

In U.S. Pat. No. 4,465,996, Boyacigiller etal proposed a method for error correction. A high accuracy digital to analog converter (DAC), which employs an EPROM to store the error values, was used to correct the errors in the output of a primary DAC. It also corrects the error by an overlapping correction method such that the error of every quantum level can be corrected.

Maio etal proposed a D/A conversion technique (in IEEE Journal of Solid State Circuits, Vol. SC-16, No. 6, Dec. 1981 "An Untrimmed D/A Converter with 14-Bit Resolution"), which features that correction values obtained from an Error Detection Circuit are stored in a RAM after comparing with the output of a Ramp Function Generator and the main DAC. In normal operation when there are input data, the corresponding correction is fetched from the RAM and then sent to a sub-DAC for correcting the output of the main DAC.

Both these methods have shortcomings. Boyacigiller's method is not automatic. Maio's method has the following drawbacks: (1) the self-calibration is not easy to accomplish; (2) an offset must be added to allow for additive and subtractive correction; (3) correction time for compensation is long; (4) the linearity of sub-DAC and Ramp Function Generator must match exactly.

SUMMARY OF THE INVENTION

The object of this invention is to store the errors of a digital to analog converter in a memory and use such stored information to correct the analog output efficiently. Another object of this invention is to speed up the DAC operation by eliminating the use of a RAMP Generator, which sweeps slowly through a wide range of reference levels. Still another object of this invention is to incorporate error correction automatically without requiring human interaction. A further object of this invention is to provide means to correct errors in bi-direction (i.e. in positive or negative directions) without requiring an offset voltage such as those used in uni-directional correction.

These objects are achieved in this invention by the method of sequential or successive approximation instead of continuous ramping for error correction. The system is divided into a main DAC and a sub-DAC. Error correction is extracted from the sub-DAC sequentially in quantum steps. The error correction, whether additive or subtractive, is determined by comparing the segment structured sub-DAC analog output currents with corresponding binary weighted reference currents at each quantum level and stored in a memory. The error extraction is speeded up by the sequential approximation (SAR) method. In normal operation, the error correction stored in the memory is recalled to compensate the analog output. To allow for bidirectional correction, auxiliary current sources may be switched in parallel with main reference current when needed.

In comparison with Maio's method, the Ramp Function Generator and the sub-DAC are replaced by a high accuracy binary weighted DAC. The time for correction is decreased by the SAR method.

Besides the above-mentioned advantages, the circuit complexity of the DAC is reduced, because the Ramp Function Generator is eliminated and the circuit automatically executes self-calibration without requiring human interaction.

BRIEF DESCRIPTION OF THE DRAWINGS

FIG. 1 shows a 3-bit segment structured current source.

FIG. 2 illustrates the correction method of this invention.

FIG. 3 shows a binary weighted reference current source.

FIG. 4 illustrates the connection of the system in normal operation.

FIG. 5 illustrates the basic schematic of a 16-bit DAC.

FIG. 6 shows a binary weighted current source as a sub-DAC.

FIG. 7 illustrate how the offset value of the comparing devices, which include two operational amplifiers and a comparator, is evaluated.

DETAILED DESCRIPTION OF THE PREFERRED EMBODIMENT

Figure 8:
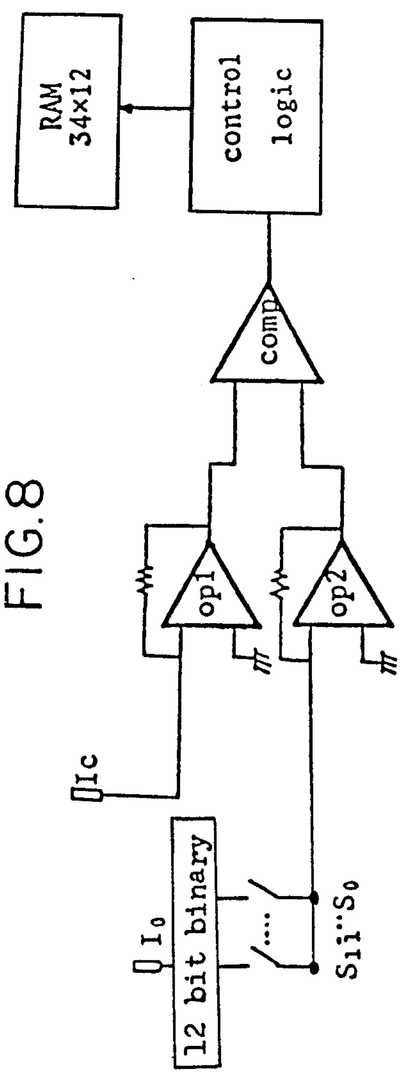
FIG. 8 illustrates how a compensating reference current is evaluated and stored in the memory.

The underlying principle of this invention is to use a segment structured DAC, in which current sources are quantized into different segments of levels. Referring to FIG. 1, a 3-bit segment structured DAC is illustrated as an example. Segmented current sources I1 through I7 (with I1=I2=I3=I4=I5=I6=I7) can be selectively summed through the switches S1 through S7. By using two mode decoders, one mode is in normal mode and the other is in correction mode. In normal mode when the binary input is 010, switches S1 and S2 are ON and the rest of the switches, OFF. The sum of these currents serves as the analog output of the DAC. In error correction mode as shown in FIG. 2 when the binary weight is 010, only switch S2 is ON, and the rest of the switches, OFF after decoding. When the binary weight is 011, only switch S3 is ON, and the rest of the switches, OFF. Each of the segment structured current sources is compared with a corresponding reference current sources Iref, which is binary-weighted. An n-bit binary weighted source is shown in FIG. 3. The reference current Iref is divided down by increasing power of 2 and these divided down currents can be summed by appropriate switching. The appropriate reference current source is obtained by the sequential approximation method. Take a 3-bit binary weighted current current source for example. If the segment DAC output current is 0.7Iref, the first sequence is to make a coarse comparison with Iref/2. After finding that 0.7Iref>Iref/2, the second sequence is to compare 0.7Iref with a finer Iref/4 resolution reference 3Iref/4. After finding that 0.7Iref<3Iref/4, the third sequence is to compare with finest Iref/8 resolution reference 5Iref/8. Thus, the approximate reference current is obtained in three successive steps instead of ramping through five Iref/8 incremental steps. The deviations are added cumulatively to obtain the error for every quantum level. The analog error, which a binary input 001 corresponds to, is the deviation of I1 from corresponding reference current. The analog error, which the binary input 010 corresponds to, is the deviation of I1 plus the deviation of I2. In succession, the error for the ith level is equal to the sum of all the deviations corresponding to this and less significant levels.

The basic correction scheme is also shown in FIG. 2. A compensating current Ic, if actual value of Ic is already known, may be added to the reference curent Iref. With this option, the analog output current Ii (1<i<7) can be corrected by the binary weighted Iref, no matter whether Ii is greater or less than Iref. For example, if I1 is less than Iref, the actual value of I1 is evaluated using a zero-crossing comparator to compare I1 with the binary weights of the reference current according to the SAR theory. From this comparison, the error value is also obtained. If I2 is larger than Iref, Ic is added to Iref to allow comparing I2 with the binary weights of Iref in parallel using a zerocrossing comparator. Then, the error value of I2 can also be obtained.

Alternatively, a binary weighted sub-DAC can be added in parallel with the segment current sources I1 through I7 as shown in FIG. 4 to compare against a fixed current. In normal operation, the correct analog output value can be obtained without adding a DC offset by turning ON or OFF the compensating current Ic. As shown in FIG. 4, when the digital data input is 010, switches S1, S2 are closed and Si (3<i<7) are open. A compensating value can be obtained through switching of Sc and I1, no matter whether the correction should be in the positive or negative direction.

The value of Ic should be designed to be smaller than Iref so the actual value of Ic can be subtracted by a binary weighted DAC to be described later. For the case when all the elements I1 through I7 of the segment DAC are larger than I0, I0 cannot be used to subtract the elements I1 through I7. When Ic is equal to $\frac{1}{2}$ Iref, the correction capability is at its best and it is not difficult in controlling the Ic to be smaller than Iref during processing.

Normally in commercial markets, high resolution DAC has 12 bits, 14 bits, 16 bits and even 20 bits for industrial instruments, test instruments or high class digital audio tape. A 16-bit DAC is described here as a preferred embodiment.

FIG. 5 shows a block diagram of a 16-bit DAC system based on this invention. A binary weighted reference source I0, as shown in FIG. 5 and similar to Iref in FIG. 4, is connected to the input of an operational amplifier OP2 or OP3. The current source I0 is divided in a binary weighted ratio as shown in FIG. 6 and can be summed by closing certain number of switches So, S1 . . . S11. A segmented DAC in parallel with a binary weighted sub-DAC I0 similar to that shown in FIG. 4 thus have current sources I0, I1 . . . I31, which can be summed through switches So, S1 . . . S42 to feed operational amplifers OP2 or OP3 dependent on T2 and T3. Two compensating current sources Ic and I32 are also connected to the input of either OP1 or OP2 through switches T4 through T7. These operational amplifiers serve as current to voltage converters. The outputs of OP1 and OP2 are connected to a comparator COMP. The comparator output is connected to a Control Logic CL, which sends out control signals for all the switches in the binary weighted DAC, the reference current sources and the compensating current sources Ic and I32 to accomplish the sequential approximation function. The control logic CL also feeds information to a random access memory RAM for storage. Such information can be fetched during normal operation for correcting the analog outputs of OP3. The Control Logic also feeds a full adder ADD for calculating the cumulative errors at different quantum levels. The output of the full adder is used to feed a Control Switch, which is used for Ic correction.

When the instrument is first turned ON, the system is on correction mode. As FIG. 5 depicts, the first step is to eliminate the offset of amplifiers OP1, OP2 and comparator COMP. If switches T1, T2 are ON, T3, T4, T5, T6 and T7 are OFF, S12 through S42 are OFF, So through S11 are controlled by the Control Logic as FIG. 7 depicts. By utilizing the SAR principle, the offset value of the amplifier loop, consisting of OP1, OP2 and COMP, is found and the correction code is stored in Address 33 of RAM as D(A33). In FIG. 8 when T10, T11 are ON and T8, T9 are OFF or when T8, T9 are ON and T10, T11 are OFF, single direction offset adjustment can be implemented.

The second step is the Ic correction. As mentioned earlier, the purpose of Ic is to enable correction in either the positive or negative direction. In FIG. 5, when switches T1, T2, T5 are ON, T3, T4, T6, T7 are OFF, S12 through S42 are OFF, S0 through S11 are controlled by the Control Switch. A simplified schematic is shown in FIG. 8. The true value of Ic is obtained by subtracting the stored offset value D(A33) from the cumulative error $D(12\text{ bit } D/A)^T$ and stored in the memory as D(A32). In the expression $D(12\text{ bit } D/A)^T$, the symbol T denotes "Transient", implying that the measured error can be different from time to time.

Figure 9:
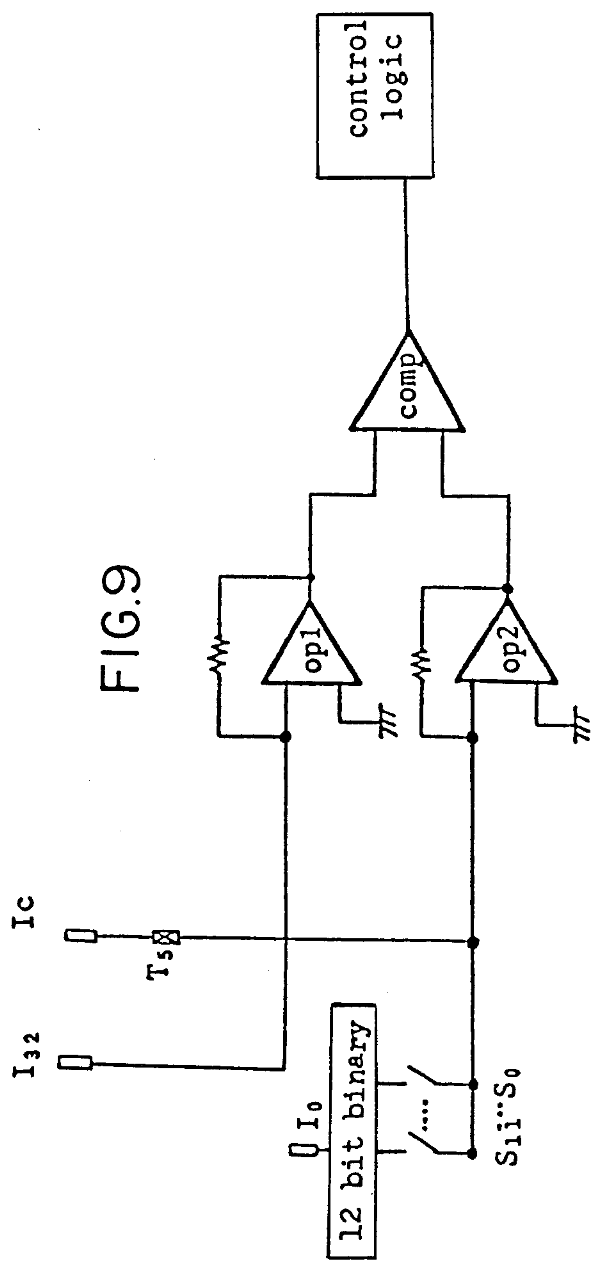
FIG. 9 illustrates how another compensating current for least significant figure is evaluated and stored in the memory.

The third step is the correction for a second compensating current source I32, which can add or subtract current from the least significant level of the sub-DAC current source I0. Without this provision, the least significant reference current source cannot be reduced. In FIG. 5, when T1, T2, T7 are ON, T3, T5, T6 are OFF, S12 through S42 are OFF, T4, S0 through S11 are controlled by Control Logic as shown in FIG. 9. When I32>I0, T5 is ON to correct the true value of I32, which is rounded off to $D(12 \text{ bit } D/A)^T + D(A32) - -D(A33)$. If I32<I0, the actual value is obtained directly by subtracting D(A33) from $D(12 \text{ bit } D/A)^T$. The actual value of I32 is then stored in the memory as D(A34).

Figures 10, 11:
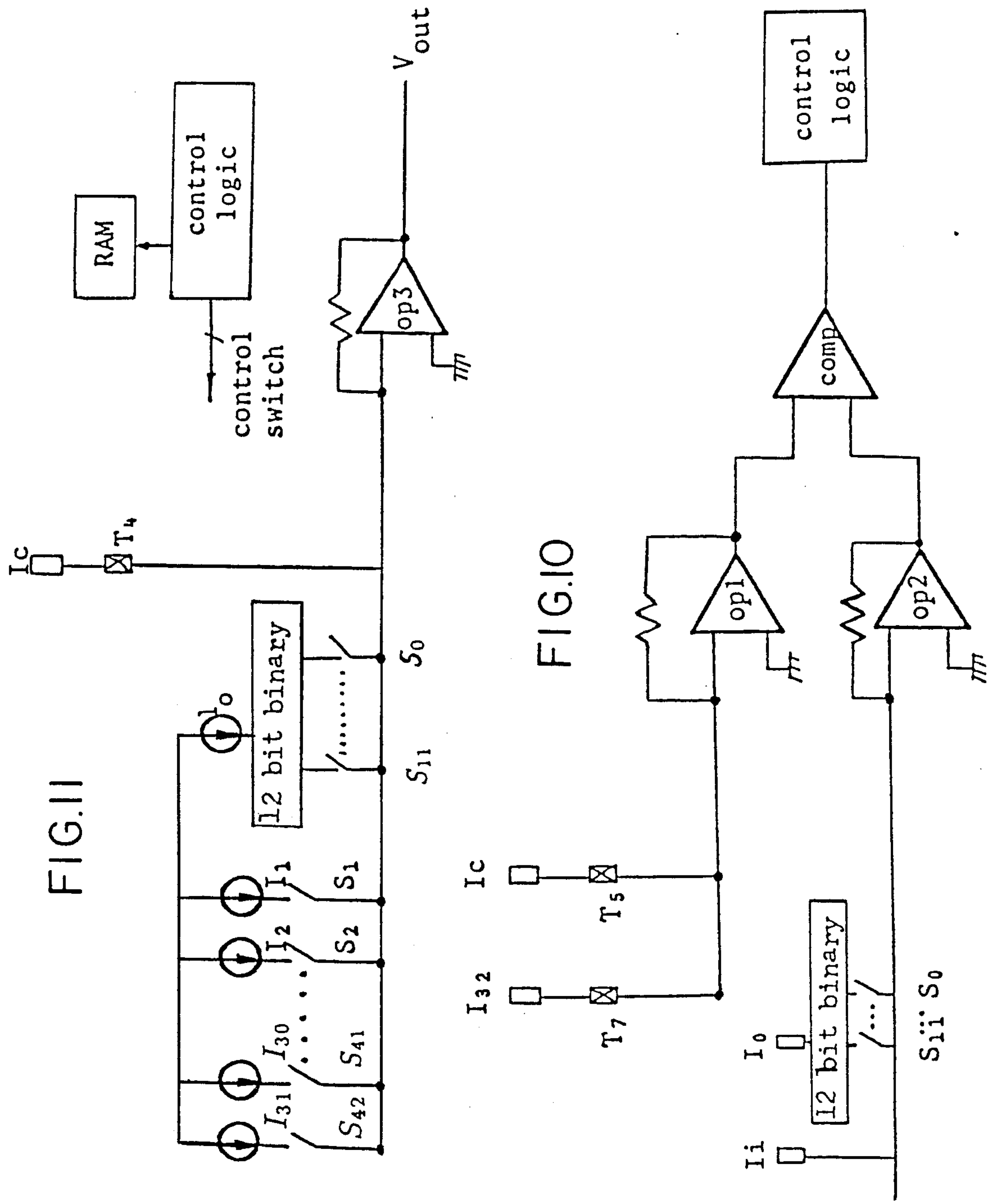
FIG. 10 illustrates how errors at different quantum levels are evaluated and stored the memory.
FIG. 11 illustrates the working status in normal operation.

The fourth step is the correction of I1 through I31. In FIG. 4, when T1, T2 are ON, T3, T4, T6 are OFF, then T5, T7 and S0 through S11 are controlled by Control Logic CL. For Ii (1<i<31) correction, S(11+i) is ON and S11 through S42 are OFF except S(11+i). As shown in FIG. 10, when I32>Ii, T7 is ON and T5 is ON, then the equivalent digital code of the true value of $Ii = D(A34) + D(A33) - D(12 \text{ bit } D/A)^T$. The deviation E(Ii) of Ii from I0 is equal to the true value of the difference between 1000(1 in Hexadecimal form) and Ii. In this case, I0 is the reference current input of the 12 bit binary weighted sub-DAC, so I0 can be replaced by a binary digital code as 1 0000 0000 0000 or replaced by a hexadecimal code such as $1000_H$ (digital code of I0) and digital code of Ii. If I32<Ii and T5, T7 are ON, then the true value of $Ii = E(I34) + D(A32) + D(A33) - D(12 \text{ bit } D/A)^T$. The accumulated error of any step n is $nI0 - -Ii(i<n<31)$, which is stored in the memory as D(An) sequentially. For example, when D(A1)=E(I1), $D(A2) - = E(I2) + D(A1)$; $D(A31) = E(I31) + D(A30)$.

After the correction mode is finished, the normal operation can begin. In normal operation, the D/A converter receives digital data input like any other type of converters. The operation of this invention is depicted in FIG. 11. In FIG. 4, when T3 is ON, T1, T2, T5, T6, T7 are OFF, then T4 and S0 through S41 are controlled by Control Logic CL as shown in FIG. 11. The following are examples: (A) When D(A4)=(+0.2 I0), the correct output is expected to be 4 I0, but the actual output value of the segment D/A has an output of 3.8 I0.

(a) When the digital input true value is 4.2 I0, the error for the first significant value 4 for SAR sequencing is found from address A4 to be D(A4)=(+0.2 I0). The operational steps are as follows:

4.2 + D(A4) = 4.2 + (+0.2)
= 4 [correct quantized value for first SAR step] + 0.4 [remainder for subsequent SAR steps]
= $3.8^T$ [segment output from I1 to I31] + $0.4^T$ [Io output from 12 bit D/A]

(b) When the digital input true value is 4.9 I0, the error for the first significant value 4 for SAR sequencing is found from address A4 to be D(A4)=0.2 I0). The execution steps are:

4.9 + D(A4) = 4.9 + (+0.2)
= 4 [correct quantized value for first SAR step] + 1.1 [remainder which exceeds next significant quantized value 1 of IO]
= 4 + Ic [compensating current] + (1.1 − Ic) [Ic subtracted from remainder to obtain a value less than the next significant value 1 of IO]
= $3.8^T$ [segment D/A output from I1 to I31] + Ic [T4 On, controlled by Control Logic] + (1.1 − D(A32) [output from 12 bit D/A; D(A32) being the stored Ic].

(B) When D(A4)=(−0.2 I0), the significant quantized value is expected to be 4, but the output value of segment D/A is 4.2I0.

(a) When digital input truth value is 4.9I0, error D(A4) for the quantized value of 4 is found from address A4 to be (−0.2I0). The operational steps are:

4.9 + D(A4) = 4.9 + (−0.2)
= 4 [correct quantized value for first SAR step] + 0.7 [remainder]
= $4.2^T$ [segment D/A output from I1 to I31] + $0.7^T$ [IO output from 12 bit D/A]

(b) When digital input truth value is 4.1 I0, error D(A4) for the quantized value of 4 is found from address A4 to be (−0.2I0). The operational steps are:

4.1 + D(A4) = 4.1 + (−0.2)
= 4 [first correct significant quantized value] + (−0.1) [negative remainder]
= 3 [first significant quantized value reduced by 1 because remainder is negative, by summing 1I4, 1I3, 1I2 without I1] + Ic [compensating current be the output of binary weighted (−0.1) is less than quantum value zero, which cannot be the output of binary weighted DAC, IO. The range of IO output is from quantum value 1, reference IO, to quantum value zero, reference IO] +((I1 − Ic) + (−0.1)IO)
= 3 [segment D/A output from I1 to I31] + Ic [T4 ON, controlled by Control Logic] + (1000H, − D(A1) − D(1A32) [output from 12 bit D/A, 1000H, hexadecimal form of 1; D(A32), stored Ic]

Since 1000H−D(A1)−D(A32) is a fixed quantity, this quantity can be stored in the RAM and recalled to speed normal operation.

What is claimed is:

1. A digital to analog conversion system using a medium resolution digital to analog converter (DAC) with error correction to obtain high resolution, comprising a segment DAC controlled by input digital data, said segment DAC having output current converted into a first voltage through a first operational amplifier, a quantized reference current source, said quantized reference current source being converted into a second voltage through a second operational amplifier, means for comparing each level of said quantized reference current source with corresponding current from said segment DAC to obtain respective error of analog output, said means for comparing comprising a comparator fed from said first voltage and said second voltage, means for storing said error in a memory, means for recalling said error for correction of analog output in normal operation 2. A digital to analog conversion system as described in claim 1 wherein, said DAC has a sub-DAC which consists of binary weighted current sources connected in parallel with said segment DAC, said segment DAC and sub-DAC parallel output current is converted into said first voltage through said first operational amplifier.

3. A digital to analog conversion system as described in claim 1, wherein said comparing means is sequenced with sequential approximation method, offset voltage error of said first operational amplifier, said second operational amplifier and said comparator are evaluated with said segment DAC and stored in said memory.

4. A digital to analog conversion system using a medium resolution digital to analog converter (DAC) with error correction to obtain high resolution, comprising a segment DAC controlled by input digital data, a quantized reference current source, means for comparing each level of said quantized reference current source with corresponding current from said segment DAC to obtain respective error of analog output using sequential approximation method.

said means for comparing includes a control logic for performing said sequential approximation function by outputting (a) control signals for said segment DAC, (b) error data into said memory for storage, a first compensating current source connected to add or subtract said quantized reference current whenever said quantized reference current source is less than corresponding current from said segment DAC, thereby allowing said comparing means to cross zero, a second compensating current connected to add on or subtract from said quantized reference current whenever the least significant quantum level of said quantized reference current source is less than corresponding current of said segment DAC, thereby allowing said comparing means to cross zero.

* * * * *